(12) United States Patent
Weng (10) Patent No.: US 8,569,885 B2
(45) Date of Patent: Oct. 29, 2013

(54) STACKED SEMICONDUCTOR PACKAGES AND RELATED METHODS

(75) Inventor: Cheng-Yi Weng, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 1 day.

(21) Appl. No.: 13/246,408

(22) Filed: Sep. 27, 2011

(65) Prior Publication Data

US 2012/0104607 A1   May 3, 2012

(30) Foreign Application Priority Data

Oct. 29, 2010  (TW) ................ 99137104 A (51) Int. Cl.
*H01L 23/48* (2006.01)
*H01L 23/02* (2006.01)

(52) U.S. Cl.
USPC .... 257/737; 257/693; 257/686; 257/E23.023; 257/E23.116; 257/E25.006; 257/E25.021; 257/E25.027; 257/E23.085; 257/E21.502

(58) Field of Classification Search
USPC .......... 257/693, 737, 738, E23.021, E23.069, 257/686, 777, E25.006, E25.013, E25.021, 257/E25.027, E23.085; 438/109, 612–617
See application file for complete search history.

(56) References Cited

U.S. PATENT DOCUMENTS

| | | |
|---|---|---|
| 3,761,309 A | 9/1973 | Schmitter et al. |
| 4,341,594 A | 7/1982 | Carlson et al. |
| 4,845,542 A | 7/1989 | Bezuk et al. |
| 5,072,289 A | 12/1991 | Sugimoto et al. |
| 5,128,831 A | 7/1992 | Fox, III et al. |
| 5,139,610 A | 8/1992 | Dunaway et al. |
| 5,207,585 A | 5/1993 | Byrnes et al. |
| 5,222,014 A | 6/1993 | Lin |
| 5,355,580 A | 10/1994 | Tsukada |
| 5,397,997 A | 3/1995 | Tuckerman et al. |
| 5,400,948 A | 3/1995 | Sajja et al. |
| 5,466,635 A | 11/1995 | Lynch et al. |
| 5,468,681 A | 11/1995 | Pasch |
| 5,579,207 A | 11/1996 | Hayden et al. |
| 5,594,275 A | 1/1997 | Kwon et al. |
| 5,608,265 A | 3/1997 | Kitano et al. |

(Continued)

FOREIGN PATENT DOCUMENTS

| | | |
|---|---|---|
| CN | 1391278 | 1/2003 |
| CN | 1835218 | 9/2006 |

(Continued)

OTHER PUBLICATIONS

Yoshida et al., "A Study on Package Stacking Process for Package-on-Package (PoP)"; Electronic Components and Tech. Conf. (ECTC), May 2006, San Diego, CA.

(Continued)

*Primary Examiner* — Jasmine Clark
(74) *Attorney, Agent, or Firm* — Klein, O'Neil & Singh, LLP (57) ABSTRACT

The present stacked semiconductor packages include a bottom package and a top package. The bottom package includes a substrate, a solder mask layer, a plurality of conductive pillars and a die electrically connected to the substrate. The solder mask layer has a plurality of openings exposing a plurality of pads on the substrate. The conductive pillars are disposed on at least a portion of the pads, and protrude from the solder mask layer.

20 Claims, 6 Drawing Sheets

(56) References Cited

U.S. PATENT DOCUMENTS

| | | | |
|---|---|---|---|
| 5,629,564 | A | 5/1997 | Nye, III et al. |
| 5,640,052 | A | 6/1997 | Tsukamoto |
| 5,656,858 | A | 8/1997 | Kondo et al. |
| 5,698,465 | A | 12/1997 | Lynch et al. |
| 5,714,800 | A | 2/1998 | Thompson |
| 5,726,493 | A | 3/1998 | Yamashita et al. |
| 5,748,452 | A | 5/1998 | Londa |
| 5,763,939 | A | 6/1998 | Yamashita |
| 5,790,377 | A | 8/1998 | Schreiber et al. |
| 5,844,315 | A | 12/1998 | Melton et al. |
| 5,861,666 | A | 1/1999 | Bellaar |
| 5,872,404 | A | 2/1999 | Lynch et al. |
| 5,883,426 | A | 3/1999 | Tokuno et al. |
| 5,889,327 | A | 3/1999 | Washida et al. |
| 5,889,655 | A | 3/1999 | Barrow |
| 5,892,290 | A | 4/1999 | Chakravorty et al. |
| 5,914,536 | A | 6/1999 | Shizuki et al. |
| 5,929,521 | A | 7/1999 | Wark et al. |
| 5,943,597 | A | 8/1999 | Kleffner et al. |
| 5,973,393 | A | 10/1999 | Chia et al. |
| 5,985,695 | A | 11/1999 | Freyman et al. |
| 6,013,571 | A | 1/2000 | Morrell |
| 6,028,357 | A | 2/2000 | Moriyama |
| 6,051,450 | A | 4/2000 | Ohsawa et al. |
| 6,072,236 | A | 6/2000 | Akram et al. |
| 6,077,765 | A | 6/2000 | Naya |
| 6,107,164 | A | 8/2000 | Ohuchi |
| 6,159,837 | A | 12/2000 | Yamaji et al. |
| 6,177,636 | B1 | 1/2001 | Fjelstad |
| 6,177,724 | B1 | 1/2001 | Sawai |
| 6,194,250 | B1 | 2/2001 | Melton et al. |
| 6,195,268 | B1 | 2/2001 | Eide |
| 6,229,220 | B1 | 5/2001 | Saitoh et al. |
| 6,281,106 | B1 | 8/2001 | Higdon et al. |
| 6,303,997 | B1 | 10/2001 | Lee |
| 6,350,705 | B1 | 2/2002 | Lin |
| 6,362,087 | B1 | 3/2002 | Wang et al. |
| 6,362,090 | B1 | 3/2002 | Paik et al. |
| 6,378,759 | B1 | 4/2002 | Ho et al. |
| 6,448,665 | B1 | 9/2002 | Nakazawa et al. |
| 6,451,624 | B1 | 9/2002 | Farnworth et al. |
| 6,461,881 | B1 | 10/2002 | Farnworth et al. |
| 6,489,676 | B2 | 12/2002 | Taniguchi et al. |
| 6,501,165 | B1 | 12/2002 | Farnworth et al. |
| 6,501,185 | B1 | 12/2002 | Chow et al. |
| 6,510,976 | B2 | 1/2003 | Hwee et al. |
| 6,513,236 | B2 | 2/2003 | Tsukamoto |
| 6,521,995 | B1 | 2/2003 | Akram et al. |
| 6,525,413 | B1 | 2/2003 | Cloud et al. |
| 6,550,666 | B2 | 4/2003 | Chew et al. |
| 6,573,598 | B2 | 6/2003 | Ohuchi et al. |
| 6,578,754 | B1 | 6/2003 | Tung |
| 6,592,019 | B2 | 7/2003 | Tung |
| 6,599,775 | B2 | 7/2003 | Tie et al. |
| 6,600,234 | B2 | 7/2003 | Kuwabara et al. |
| 6,614,104 | B2 | 9/2003 | Farnworth et al. |
| 6,617,687 | B2 | 9/2003 | Akram et al. |
| 6,639,299 | B2 | 10/2003 | Aoki |
| 6,642,136 | B1 | 11/2003 | Lee et al. |
| 6,664,128 | B2 | 12/2003 | Tong et al. |
| 6,681,982 | B2 | 1/2004 | Tung |
| 6,683,375 | B2 | 1/2004 | Joshi et al. |
| 6,731,003 | B2 | 5/2004 | Joshi et al. |
| 6,732,913 | B2 | 5/2004 | Alvarez |
| 6,734,039 | B2 | 5/2004 | Hwee et al. |
| 6,740,546 | B2 | 5/2004 | Corisis et al. |
| 6,740,577 | B2 | 5/2004 | Jin et al. |
| 6,740,964 | B2 | 5/2004 | Sasaki |
| 6,750,082 | B2 | 6/2004 | Briar et al. |
| 6,756,671 | B2 | 6/2004 | Lee et al. |
| 6,780,746 | B2 | 8/2004 | Kinsman et al. |
| 6,784,087 | B2 | 8/2004 | Lee et al. |
| 6,787,392 | B2 | 9/2004 | Quah |
| 6,798,057 | B2 | 9/2004 | Bolkin et al. |
| 6,812,066 | B2 | 11/2004 | Taniguchi et al. |
| 6,815,254 | B2 | 11/2004 | Mistry et al. |
| 6,818,545 | B2 | 11/2004 | Lee et al. |
| 6,828,665 | B2 | 12/2004 | Pu et al. |
| 6,847,109 | B2 | 1/2005 | Shim |
| 6,861,288 | B2 | 3/2005 | Shim et al. |
| 6,888,209 | B2 | 5/2005 | Jobetto |
| 6,888,255 | B2 | 5/2005 | Murtuza et al. |
| 6,917,119 | B2 | 7/2005 | Lee et al. |
| 6,924,550 | B2 | 8/2005 | Corisis et al. |
| 6,929,981 | B2 | 8/2005 | Hwee et al. |
| 6,936,930 | B2 | 8/2005 | Wang |
| 6,940,168 | B2 | 9/2005 | Garrity et al. |
| 6,974,334 | B2 | 12/2005 | Hung |
| 7,002,805 | B2 | 2/2006 | Lee et al. |
| 7,008,867 | B2 | 3/2006 | Lei |
| 7,015,571 | B2 | 3/2006 | Chang et al. |
| 7,022,548 | B2 | 4/2006 | Joshi et al. |
| 7,026,709 | B2 | 4/2006 | Tsai et al. |
| 7,029,953 | B2 | 4/2006 | Sasaki |
| 7,034,386 | B2 | 4/2006 | Kurita |
| 7,049,692 | B2 | 5/2006 | Nishimura et al. |
| 7,061,079 | B2 | 6/2006 | Weng et al. |
| 7,071,028 | B2 | 7/2006 | Koike et al. |
| 7,087,458 | B2 | 8/2006 | Wang et al. |
| 7,122,403 | B2 | 10/2006 | Chandran et al. |
| 7,129,576 | B2 | 10/2006 | Humpston |
| 7,135,770 | B2 | 11/2006 | Nishiyama et al. |
| 7,185,426 | B1 | 3/2007 | Hiner et al. |
| 7,187,068 | B2 | 3/2007 | Suh et al. |
| 7,221,045 | B2 | 5/2007 | Park et al. |
| 7,242,081 | B1 | 7/2007 | Lee |
| 7,242,099 | B2 | 7/2007 | Lin et al. |
| 7,262,080 | B2 | 8/2007 | Go et al. |
| 7,268,438 | B2 | 9/2007 | Nishiyama et al. |
| 7,276,801 | B2 | 10/2007 | Dubin et al. |
| 7,279,784 | B2 | 10/2007 | Liu |
| 7,279,789 | B2 | 10/2007 | Cheng |
| 7,288,835 | B2 | 10/2007 | Yim et al. |
| 7,291,929 | B2 | 11/2007 | Tanaka et al. |
| 7,309,913 | B2 | 12/2007 | Shim et al. |
| 7,345,361 | B2 | 3/2008 | Mallik et al. |
| 7,354,800 | B2 | 4/2008 | Carson |
| 7,361,990 | B2 | 4/2008 | Lu et al. |
| 7,364,945 | B2 | 4/2008 | Shim et al. |
| 7,364,948 | B2 | 4/2008 | Lai et al. |
| 7,365,427 | B2 | 4/2008 | Lu et al. |
| 7,372,141 | B2 | 5/2008 | Karnezos et al. |
| 7,372,151 | B1 | 5/2008 | Fan et al. |
| 7,391,112 | B2 | 6/2008 | Li et al. |
| 7,394,663 | B2 | 7/2008 | Yamashita et al. |
| 7,408,244 | B2 | 8/2008 | Lee et al. |
| 7,417,329 | B2 | 8/2008 | Chuang et al. |
| 7,429,786 | B2 * | 9/2008 | Karnezos et al. ............ 257/686 |
| 7,429,787 | B2 | 9/2008 | Karnezos et al. |
| 7,436,055 | B2 | 10/2008 | Hu |
| 7,436,074 | B2 | 10/2008 | Pan et al. |
| 7,449,406 | B2 | 11/2008 | Nishiyama et al. |
| 7,456,496 | B2 | 11/2008 | Hwee et al. |
| 7,462,942 | B2 | 12/2008 | Tan et al. |
| 7,473,629 | B2 | 1/2009 | Tai et al. |
| 7,476,564 | B2 | 1/2009 | Chen et al. |
| 7,485,970 | B2 | 2/2009 | Hsu et al. |
| 7,498,666 | B2 * | 3/2009 | Hussa ......................... 257/686 |
| 7,550,375 | B2 | 6/2009 | Wang et al. |
| 7,550,832 | B2 | 6/2009 | Weng et al. |
| 7,550,836 | B2 | 6/2009 | Chou et al. |
| 7,560,818 | B2 | 7/2009 | Tsai |
| 7,586,184 | B2 | 9/2009 | Hung et al. |
| 7,589,408 | B2 | 9/2009 | Weng et al. |
| 7,633,765 | B1 | 12/2009 | Scanlan et al. |
| 7,642,133 | B2 | 1/2010 | Wu et al. |
| 7,671,457 | B2 | 3/2010 | Hiner et al. |
| 7,719,094 | B2 | 5/2010 | Wu et al. |
| 7,723,839 | B2 | 5/2010 | Yano et al. |
| 7,728,431 | B2 | 6/2010 | Harada et al. |
| 7,737,539 | B2 | 6/2010 | Kwon et al. |
| 7,737,565 | B2 | 6/2010 | Coffy |
| 7,750,455 | B2 | 7/2010 | Pagaila et al. |
| 7,777,351 | B1 | 8/2010 | Berry et al. |

(56) References Cited

U.S. PATENT DOCUMENTS

| | | | |
|---|---|---|---|
| 7,807,512 B2 | 10/2010 | Lee et al. | |
| 7,834,464 B2 | 11/2010 | Meyer et al. | |
| 7,838,334 B2 | 11/2010 | Yu et al. | |
| 7,928,557 B2 * | 4/2011 | Oi et al. | 257/697 |
| 7,932,170 B1 | 4/2011 | Huemoeller et al. | |
| 8,039,303 B2 | 10/2011 | Shim et al. | |
| 2002/0011664 A1 | 1/2002 | Tanaka | |
| 2003/0015782 A1 * | 1/2003 | Choi et al. | 257/686 |
| 2003/0090883 A1 | 5/2003 | Asahi et al. | |
| 2003/0127734 A1 | 7/2003 | Lee et al. | |
| 2003/0129272 A1 | 7/2003 | Shen et al. | |
| 2003/0129822 A1 | 7/2003 | Lee et al. | |
| 2003/0219966 A1 | 11/2003 | Jin et al. | |
| 2004/0087057 A1 | 5/2004 | Wang et al. | |
| 2004/0106232 A1 | 6/2004 | Sakuyama et al. | |
| 2004/0124515 A1 | 7/2004 | Tao et al. | |
| 2004/0191955 A1 | 9/2004 | Joshi et al. | |
| 2005/0029644 A1 | 2/2005 | Ho et al. | |
| 2005/0054187 A1 | 3/2005 | Ding et al. | |
| 2005/0072834 A1 * | 4/2005 | Zeng | 228/180.22 |
| 2005/0117835 A1 | 6/2005 | Nguyen et al. | |
| 2005/0121764 A1 | 6/2005 | Mallik | |
| 2006/0006544 A1 | 1/2006 | Farrar | |
| 2006/0035409 A1 | 2/2006 | Suh et al. | |
| 2006/0220210 A1 | 10/2006 | Karnezos et al. | |
| 2006/0240595 A1 | 10/2006 | Lee | |
| 2006/0244117 A1 | 11/2006 | Karnezos et al. | |
| 2007/0004086 A1 | 1/2007 | Hua et al. | |
| 2007/0029668 A1 | 2/2007 | Lin et al. | |
| 2007/0075423 A1 | 4/2007 | Ke et al. | |
| 2007/0090508 A1 | 4/2007 | Lin et al. | |
| 2007/0108583 A1 | 5/2007 | Shim et al. | |
| 2007/0241453 A1 | 10/2007 | Ha et al. | |
| 2007/0273049 A1 | 11/2007 | Khan et al. | |
| 2007/0290376 A1 | 12/2007 | Zhao et al. | |
| 2008/0017968 A1 | 1/2008 | Choi et al. | |
| 2008/0073769 A1 | 3/2008 | Wu et al. | |
| 2008/0116574 A1 | 5/2008 | Fan | |
| 2008/0150161 A1 | 6/2008 | Lin et al. | |
| 2008/0230887 A1 | 9/2008 | Sun et al. | |
| 2008/0296761 A1 | 12/2008 | Lee et al. | |
| 2009/0072385 A1 | 3/2009 | Alley et al. | |
| 2009/0096092 A1 | 4/2009 | Patel | |
| 2009/0101400 A1 | 4/2009 | Yamakoshi | |
| 2009/0127686 A1 | 5/2009 | Yang et al. | |
| 2009/0155955 A1 | 6/2009 | Liang | |
| 2009/0289360 A1 | 11/2009 | Takahashi et al. | |
| 2010/0000775 A1 | 1/2010 | Shen et al. | |
| 2010/0052186 A1 * | 3/2010 | Appelt et al. | 257/777 |
| 2010/0171205 A1 | 7/2010 | Chen et al. | |
| 2010/0171206 A1 | 7/2010 | Chu et al. | |
| 2010/0171207 A1 | 7/2010 | Shen et al. | |
| 2010/0214780 A1 | 8/2010 | Villard | |
| 2010/0244024 A1 | 9/2010 | Do et al. | |
| 2010/0244208 A1 | 9/2010 | Pagaila et al. | |
| 2010/0320585 A1 | 12/2010 | Jiang et al. | |
| 2011/0049704 A1 | 3/2011 | Sun et al. | |
| 2011/0068453 A1 | 3/2011 | Cho et al. | |
| 2011/0084381 A1 | 4/2011 | Lo et al. | |
| 2011/0084389 A1 | 4/2011 | Lo et al. | |
| 2011/0117700 A1 | 5/2011 | Weng et al. | |
| 2011/0140364 A1 | 6/2011 | Head | |
| 2011/0156251 A1 | 6/2011 | Chu et al. | |
| 2011/0174527 A1 * | 7/2011 | Nagamatsu et al. | 174/261 |
| 2011/0241192 A1 | 10/2011 | Ding et al. | |
| 2011/0241193 A1 * | 10/2011 | Ding et al. | 257/686 |
| 2011/0278741 A1 | 11/2011 | Chua et al. | |
| 2012/0074532 A1 | 3/2012 | Shih et al. | |

FOREIGN PATENT DOCUMENTS

| | | |
|---|---|---|
| CN | 1866504 | 11/2006 |
| JP | 54128669 | 10/1979 |
| JP | 60217646 | 10/1985 |
| JP | 62160744 | 7/1987 |
| JP | 1123440 | 5/1989 |
| JP | 4144143 | 5/1992 |
| JP | 5109820 | 4/1993 |
| JP | 5152376 | 6/1993 |
| JP | 5315339 | 11/1993 |
| JP | 7211722 | 8/1995 |
| JP | 7335648 | 12/1995 |
| JP | 07335783 | 12/1995 |
| JP | 8008259 | 1/1996 |
| JP | 8013166 | 1/1996 |
| JP | 9045691 | 2/1997 |
| JP | 9266230 | 10/1997 |
| JP | 2000091371 | 3/2000 |
| JP | 2000269387 | 9/2000 |
| JP | 2000294720 | 10/2000 |
| JP | 2001298115 | 10/2001 |
| JP | 2002043352 | 2/2002 |
| JP | 2002158312 | 5/2002 |
| JP | 2002170906 | 6/2002 |
| JP | 2004327855 | 11/2004 |
| JP | 2006279062 | 10/2006 |
| JP | 2008047667 | 2/2008 |
| JP | 2009054686 | 3/2009 |
| KR | 2002043435 | 6/2002 |
| KR | 2003001963 | 1/2010 |
| TW | 0529155 | 4/2003 |
| TW | 1229927 | 3/2005 |
| TW | 200611305 | 1/2006 |

OTHER PUBLICATIONS

Dreiza et al., "High Density PoP (Package-on-Package) and Package Stacking Development"; Electronic Components and Technology Conference, 2007.

Wang et al., "Coupled power and thermal cycling reliability of board-level package-on-package atacking assembly" IEEE Transactions on Electronics Packaging Manufacturing, 32(1): 14-21, 2009.

Lai et al., "Optimization of thermomechanical reliability of board-level package-on-package stacking assembly" IEEE Transactions on Components and Packaging Technologies, 29(4): 864-868, 2006.

Wang et al., "Board-level reliability of package-on-package stacking assemblies subjected to coupled power and thermal cycling tests" 9th Electronics Packaging Technology Conference, 2007.

* cited by examiner

STACKED SEMICONDUCTOR PACKAGES AND RELATED METHODS

CROSS-REFERENCE TO RELATED APPLICATION

This application claims the benefit of priority from Taiwan Patent Application No. 099137104, filed on Oct. 29, 2010.

TECHNICAL FIELD

The present invention relates to a semiconductor package and a method for making a semiconductor package and, more particularly, to a stacked semiconductor package and a method for making a semiconductor package.

BACKGROUND

The conventional stacked semiconductor package has a bottom package and a top package. The bottom package comprises a substrate, a solder mask layer, a die and a molding compound. The substrate has an upper surface, a plurality of first pads and a plurality of second pads. The second pads are disposed on the upper surface. The solder mask layer is disposed on the upper surface, and has a plurality of openings exposing the first pads and the second pads. The die is attached to the solder mask layer by an adhesive layer, and electrically connected to the first pads by a plurality of wires. The molding compound encapsulates part of the solder mask layer, the wires and the die.

The top package comprises a plurality of solder balls. The solder balls contact the second pads, so that the top package is electrically connected to the bottom package.

One disadvantage of the conventional stacked semiconductor package is that as the distance between neighboring solder balls decreases, the diameter of each solder ball must also decrease. Therefore, when the thickness of the die and/or molding compound cannot be sufficiently thinned to accommodate the reduced diameter solder balls, the top package may not properly connect electrically to the bottom package.

Therefore, it would be advantageous to provide stacked semiconductor packages and methods of making semiconductor packages to address the above-mentioned problems.

SUMMARY

One of the present embodiments comprises a semiconductor device package. The package comprises a substrate having an upper surface, a plurality of pads disposed on the substrate upper surface, and a die electrically connected to the substrate. A solder mask layer is disposed on the substrate upper surface and has a plurality of openings exposing the pads. A plurality of conductive pillars are disposed on at least a subset of the pads. At least a portion of the conductive pillars protrude from the solder mask layer.

Another of the present embodiments comprises a semiconductor device package. The package comprises a substrate having an upper surface, a plurality of pads disposed on the substrate upper surface, and a die electrically connected to the substrate. A solder mask layer is disposed on the substrate upper surface and has a plurality of openings exposing the pads. A plurality of conductive pillars are disposed on at least a subset of the pads. The conductive pillars have a lesser width than the pads, such that the solder mask layer covers outer edges of upper surfaces of the pads.

Another of the present embodiments comprises a method of making a semiconductor device package. The method comprises providing a substrate, wherein the substrate has an upper surface, a solder mask layer and a plurality of pads, the pads and the solder mask layer are disposed on the upper surface, and the solder mask layer has a plurality of openings exposing the pads. The method further comprises forming an insulation layer on the solder mask layer, wherein the insulation layer has a plurality of peripheral openings, the positions of which correspond to those of at least a portion of the openings. The method further comprises forming a plurality of conductive pillars in the peripheral openings on at least a portion of the pads, wherein at least a portion of the conductive pillars protrude from the solder mask layer. The method further comprises removing the insulation layer. The method further comprises electrically connecting a die to the substrate. The method further comprises forming a mold to cover the solder mask layer, wherein the mold has a central cavity and a plurality of peripheral cavities, the central cavity accommodates the die, and the peripheral cavities accommodate the conductive pillars. The method further comprises adding a molding compound into the central cavity to encapsulate the die and at least a part of the solder mask layer.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION

Figure 1:
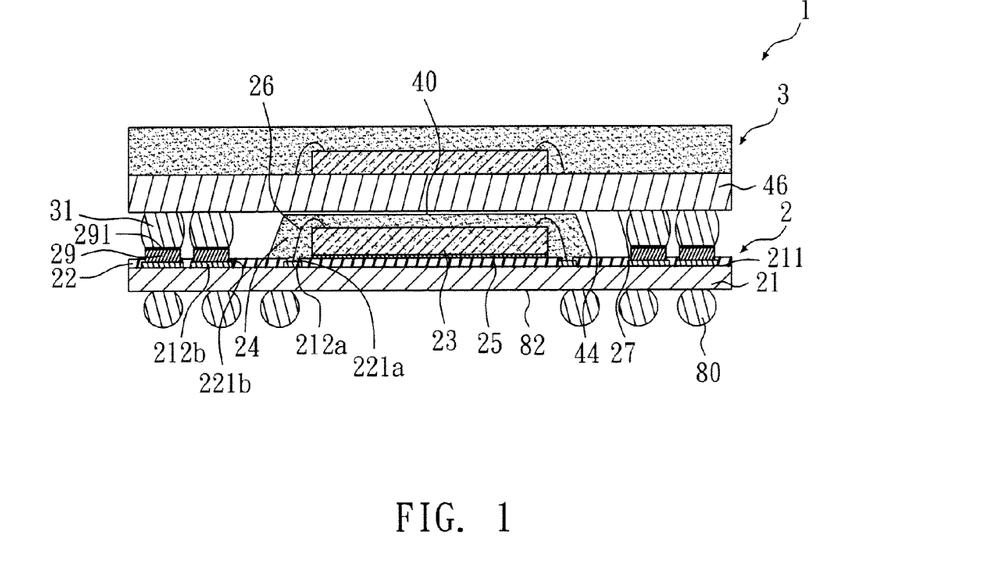
FIG. 1 is a cross-sectional view illustrating a stacked semiconductor package according to one of the present embodiments.

Referring to FIG. 1, a cross-sectional view of a stacked semiconductor package according to one of the present embodiments is illustrated. The stacked semiconductor package 1 comprises a bottom package 2 and a top package 3. The bottom package 2 comprises a substrate 21, a solder mask layer 22, a plurality of conductive pillars 29, a die 23 and a molding compound 24. The solder mask layer 22, the conductive pillars 29, the die 23, and the molding compound 24 are all mounted adjacent an upper surface 211 of the substrate 21.

The upper surface 211 further includes a plurality of pads mounted thereon, which are divided into a plurality of first pads 212a and a plurality of second pads 212b. The first pads 212a are wire bond pads used for electrically connecting the die 23, and the second pads 212b are interconnect pads used for electrically connecting the bottom package 2 with the top package 3. The solder mask layer 22 has a plurality of openings exposing the pads 212a and 212b. In the illustrated embodiment, the openings comprise a plurality of first openings 221a and a plurality of second openings 221b. The positions of the first openings 221a correspond to those of the first pads 212a such that the first pads 212a are exposed. The positions of the second openings 221b correspond to those of the second pads 212b such that the second pads 212b are exposed.

The conductive pillars 29 are disposed on the second pads 212b and aligned with the second openings 221b. The conductive pillars 29 are electrically connected to the second pads 212b. Preferably, an upper surface of each pad (the first pads 212a and the second pads 212b) further comprises a finish layer (not shown) such as a plating layer to enhance the electrical connection. The conductive pillars 29 are disposed on the finish layers of the second pads 212b, and upper surfaces of the conductive pillars 29 may also have a finish layer 291, which may or may not be the same material(s) as the pad finished layers. For example, the material(s) of the pad finish layer and/or the pillar finish layer 291 may be nickel (Ni), gold (Au). Ni/Au, palladium (Pd), Ni/Pd/Au or Organic Solderability Preservative (OSP) and the material of the conductive pillars 29 may be copper.

The solder mask layer 22 covers portions of the first pads 212a and the second pads 212b, so as to define the sizes of the first openings 221a and the second openings 221b, respectively. A width of the conductive pillars 29 may be substantially the same as the width of the openings 221b. Portions of the solder mask layer 22 may also contact side surfaces of the conductive pillars 29. For embodiments in which the width of the conductive pillars 29 is less than the width of the openings 221b, portions of the solder mask layer 22 may also contact upper surfaces of the first pads 212a and the second pads 212b. The conductive pillars 29 may have a greater height than a thickness of the solder mask layer 22, such that the conductive pillars 29 protrude from the solder mask layer 22.

The die 23 is mechanically and electrically connected to the substrate 21. In the illustrated embodiment, the die 23 is attached to the solder mask layer 22 by an adhesive layer 25, and electrically connected to the first pads 212a by a plurality of bond wires 26. The material of the wires 26 may be gold or copper, or any other conductive material.

The molding compound 24 encapsulates portions of the solder mask layer 22, the die 23, the wires 26 and the first pads 212a. However, the molding compound 24 does not encapsulate the second pads 212b or the conductive pillars 29. In alternative embodiments, the configuration of the molding compound 24 may differ, e.g. it may not encapsulate portions of the solder mask layer 22, the die 23, the wires 26 and/or the first pads 212a, and it may encapsulate portions of the second pads 212b and/or the conductive pillars 29. The height or thickness of the mold compound 24 may depend upon the die 23 thickness, a loop height of the wires 26, and/or the pitch and diameter of interconnects to the top package 3, as described further below.

The top package 3 is stacked on the bottom package 2, and electrically connected to the conductive pillars 29. A top surface 40 of the molding compound 24 may either touch or not touch a bottom surface 44 of the substrate 46 of the top package 3. In certain embodiments, there is a gap of approximately 30 μm between the top surface 40 of the molding compound 24 and the bottom surface 44 of the substrate 46 of the top package 3. This configuration helps to avoid warpage during reflow.

In the embodiment illustrated in FIG. 1, the top package 3 comprises a plurality of conductive elements 31, for example, solder balls. The conductive elements 31 contact the conductive pillars 29 (or the pillar finish layer 291). If the conductive elements 31 comprise solder material, such as tin (Sn), silver (Ag), or an Sn/Ag alloy, while the pillar finish layer 291 comprises Ni, the solder material will be unlikely to wick the side surfaces of the conductive pillars 29. This feature may aid in preventing solder bridges between conductive pillars 29, which in turn can increase manufacturing yields. The finish layer 291 may also serve as a barrier layer to prevent solder material from diffusing into the conductive pillars 29. Tin within the conductive elements 31 may react with the finish layer 291 to form an inter-metallic compound that reduces the growing rate of another inter-metallic compound that may result from a reaction between the tin within the conductive elements 31 and copper in the conductive pillars 29.

Figure 2:
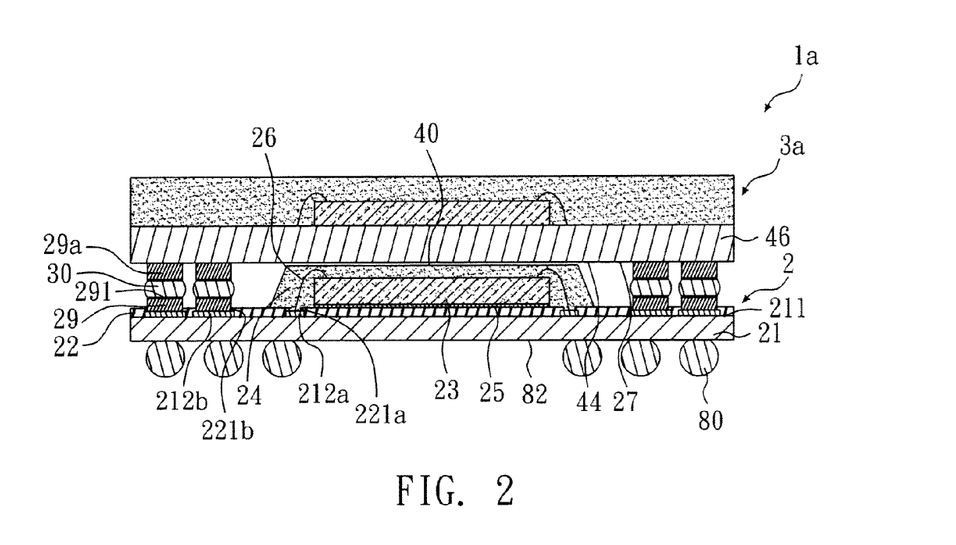
FIG. 2 is a cross-sectional view illustrating a stacked semiconductor package according to another of the present embodiments.

In certain embodiments, the pitch between the conductive elements 31 may be about 0.4 mm, the maximum thickness of the molding compound 24 of the bottom package 2 may be about 0.22 mm, and the gap between the top surface of the molding compound 24 and the bottom surface of the substrate of the top package 3 may be about 30 μm. In such embodiments, the height of the conductive elements 31 is preferably at least about 0.25 mm. However, the maximum diameter of the conductive elements 31 is preferably about 0.25 mm, which will reduce to 0.16±0.05 mm after reflow. A maximum diameter of 0.25 mm leaves a gap of about 0.15 mm between adjacent conductive elements 31 to reduce the likelihood of shorting. Thus, the maximum diameter of the conductive elements 31 after reflow is 0.21 mm. This diameter may be insufficient to span the distance between the second pads 212b and a lower surface 27 of the top package 3. The result may be an open circuit in which the top package 3 is not sufficiently electrically connected to the bottom package 2. Therefore, the conductive pillars 29 add thickness on top of the second pads 212b to increase the likelihood of a good connection between the top package 3 and the bottom package 2. In certain embodiments, the height of the conductive pillars 29 may be about 45 μm-130 μm. The diameter of the conductive pillars 29 may be substantially the same as the diameter of the conductive elements 31. Referring to FIG. 2, a cross-sectional view of a stacked semiconductor package 1a according to another of the present embodiments is illustrated. The stacked semiconductor package 1a according to this embodiment is substantially similar to the stacked semiconductor package 1 illustrated in FIG. 1. However, in this embodiment, a plurality of conductive pillars 29a is formed on a lower surface of the top package 3a. The conductive pillars 29a connect with the conductive pillars 29 of the bottom package 2 through the conductive elements 31. The conductive elements 31 join the copper pillars 29a and the copper pillars 29 mechanically and electrically. If the copper pillar 29a includes a finish layer comprising nickel, the conductive elements 31 will be less likely to wick the side surfaces of the copper pillars 29a.

Figure 3:
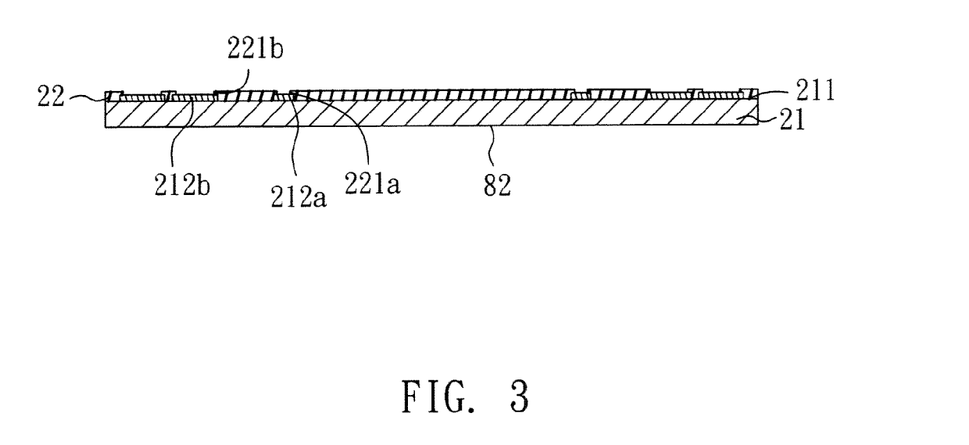
FIGS. 3-9 are cross-sectional views illustrating one of the present embodiments of a method of making a stacked semiconductor package.

Referring to FIGS. 3-9, cross-sectional views of a method for making a stacked semiconductor package according to one of the present embodiments are illustrated. FIG. 3 illustrates the substrate 21, which may be an organic material, such as polyimide tape, fiberglass reinforced bismaleimide-triazine (BT) resin, FR-4 fiberglass reinforced BT epoxy resin. Ajinomoto Build-Up Film (ABF), or any other dielectric material(s). The substrate 21 has the upper surface 211 with the solder mask layer 22, the plurality of first pads 212a, and the plurality of second pads 212b formed thereon. The solder mask layer 22 has the plurality of first and second openings 221a, 221b exposing the pads 212a, 212b, respectively. In this embodiment, the openings 221a, 221b are smaller than the pads 212a, 212b, so that edge portions of upper surfaces of the pads 212a, 212b are covered by the solder mask layer 22, and the openings define the exposed areas of the pads 212a, 212b.

Figure 4:
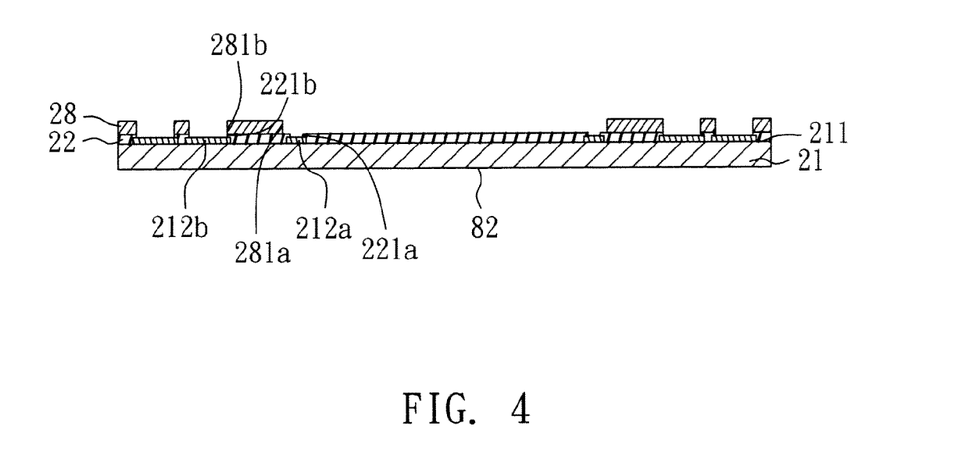

Referring to FIG. 4, an insulation layer 28, is formed on the solder mask layer 22. The material of the insulation layer 28 may be the same as or different from that of the solder mask layer 22. The insulation layer 28 may, for example, comprise a photoresist. The insulation layer 28 includes a plurality of peripheral openings 281b, whose positions peripheral openings correspond to those of the second openings 221b of the solder mask layer 22. Preferably, the peripheral openings 281b a cross-sectional area of each of the peripheral openings 281b is substantially the same as that of each of the second openings 221b. In this embodiment, the insulation layer 28 further includes a central opening 281a, and the peripheral openings 281b surround the central opening 281a. The central opening 281a exposes the first pads 212a and part of the solder mask layer 22 where the die 23 will subsequently be positioned.

Figure 5:
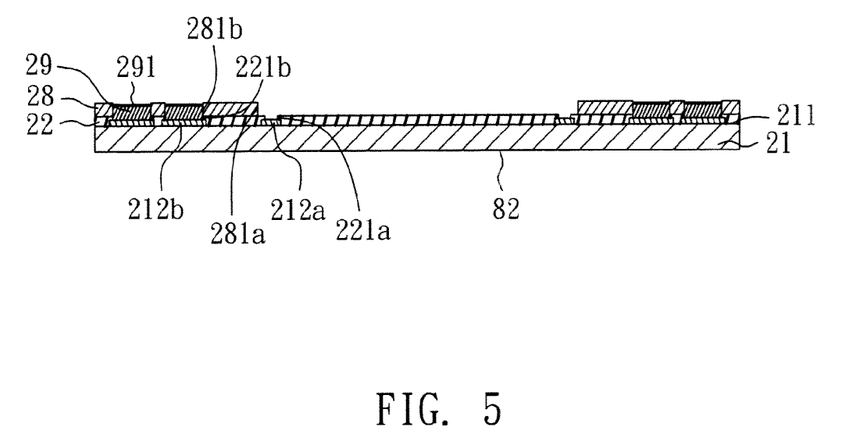

Referring to FIG. 5, the plurality of conductive pillars 29 are formed in the peripheral openings 281b on the second pads 212b. For example, the conductive pillars 29 may be formed by plating, printing, or any other method. The conductive pillars 29 are electrically connected to the second pads 212b. The conductive pillars 29 fill the peripheral openings 281b and the second openings 221b, but do not extend beyond the insulation layer 28. In certain embodiments, an upper surface of each pad 212a, 212b further comprises a finish layer (not shown). In such embodiments, the conductive pillars 29 are disposed on the finish layer of the second pads 212b. The method according to this embodiment may further comprise forming a finish layer 291 on an upper surface of the conductive pillars 29.

In some embodiments, the widths of the peripheral openings 281b could be larger or smaller than the second openings 221b, and the thickness thereof can be adjusted as desired. The material of the insulation layer 28 may be as the same as or different than that of the solder mask layer 22. For example, the insulation layer 28 may be a photoresist, which has a different etching rate compared with the solder mask layer 22.

Figure 6:
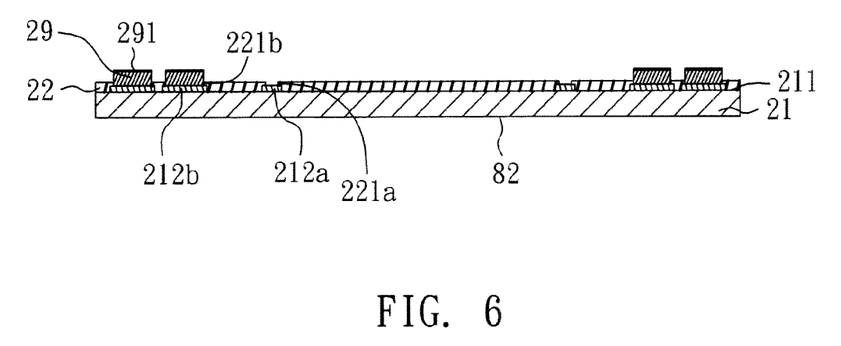
Figure 7:
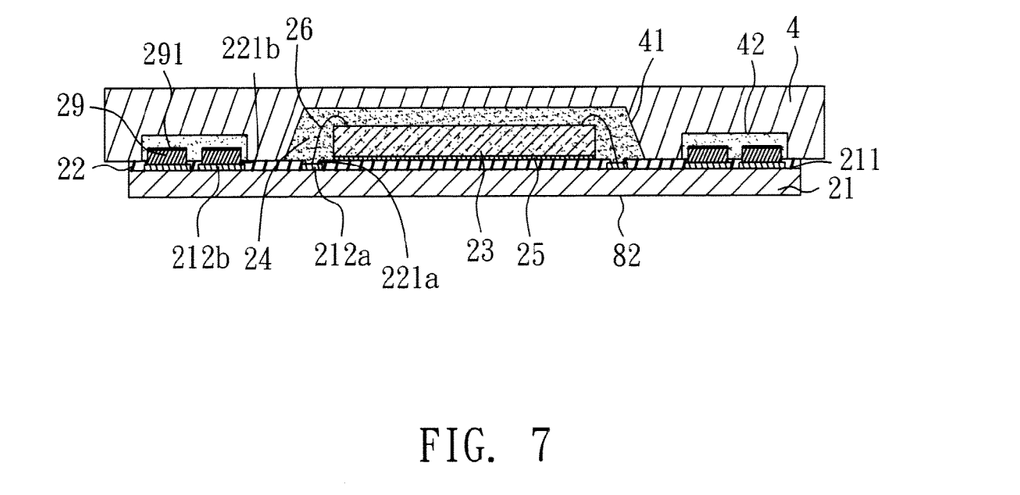

Referring to FIG. 6, the insulation layer 28 is removed, so that the conductive pillars 29 protrude from the solder mask layer 22 due to the thickness or height of the conductive pillars 29 being greater than the thickness or height of the solder mask layer 22. Referring to FIG. 7, the die 23 is mechanically and electrically connected to the substrate 21. The die 23 is attached to the solder mask layer 22 by the adhesive layer 25, and electrically connected to the first pads 212a of the substrate 21 by the plurality of bond wires 26. Then, a mold 4 is placed over the upper surface of the substrate 21. The mold 4 has a central cavity 41 in which the die 23 and wires 26 reside, and a plurality of peripheral cavities 42 in which the conductive pillars 29 reside. The molding compound 24 is transferred into the central cavity 41 to encapsulate the die 23 and the wires 26. The molding compound 24 overlays portions of the solder mask layer 22 contained within the cavity 41. No molding compound is permitted to enter the cavities 42 in which the conductive pillars 29 reside. Thus, mold flash is prevented from contaminating or adhering to the conductive pillars 29.

Figure 8:
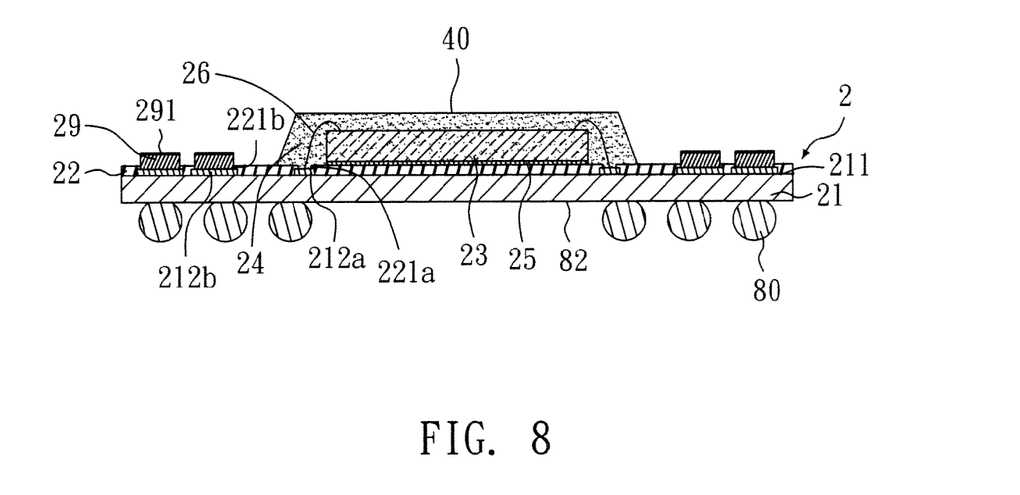

Then, in FIG. 8, the mold 4 is removed, and a plurality of conductive elements 80 are formed on the bottom surface 82 of the substrate 21. The conductive elements 80 may comprise, for example, solder balls. In other embodiments, the molding compound 24 may be omitted. In such embodiments, therefore, the steps of providing the mold 4 and pouring the molding compound 24 may be omitted.

Figure 9:
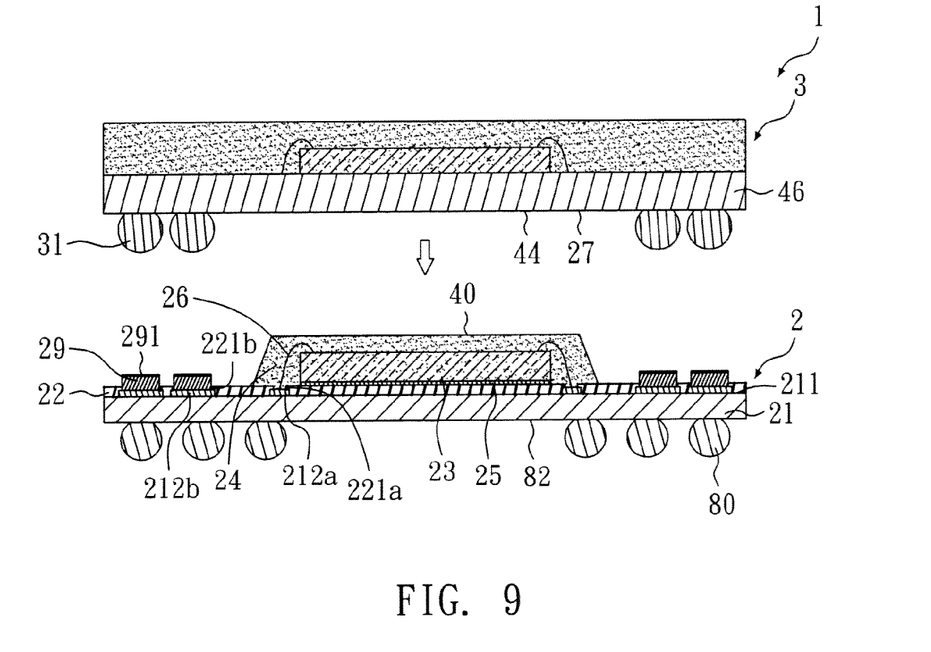

Referring to FIG. 9, the top package 3 is stacked atop the bottom package 2 to form the package 1 of FIG. 1. In this embodiment, the top package 3 comprises a plurality of conductive elements 31, which may be, for example, solder balls. The conductive elements 31 electrically connect the top package 3 to the bottom package 2 via the conductive pillars 29. The conductive elements 31 contact the conductive pillars 29 (or the pillar finish layer 291 of the conductive pillars 29) to form a stacked semiconductor package 1.

Figure 10:
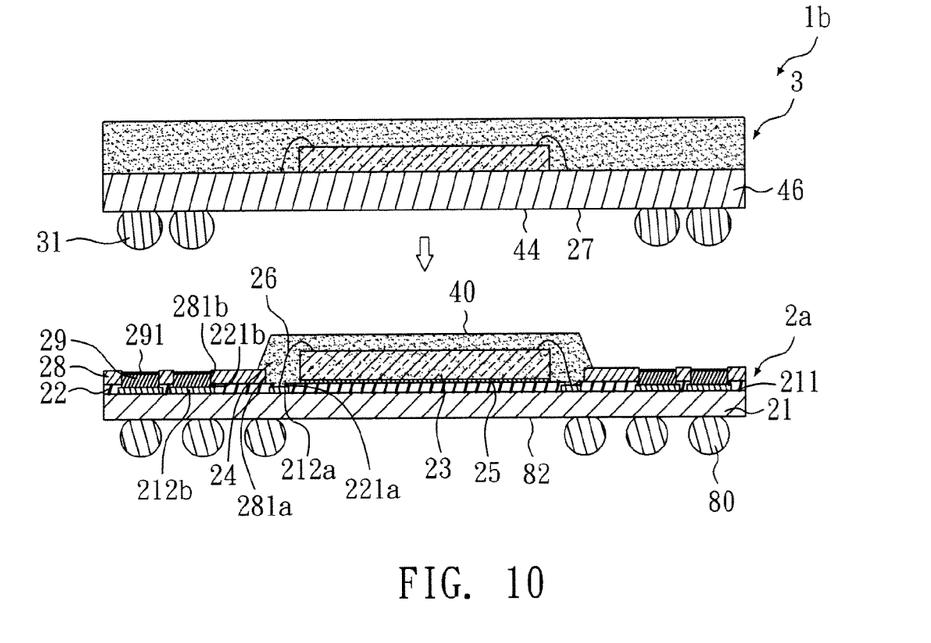
FIG. 10 is a cross-sectional view illustrating a stacked semiconductor package according to another of the present embodiments.

Referring to FIG. 10, a cross-sectional view of a stacked semiconductor package 1b according to another of the present embodiments is illustrated. In this embodiment, the insulation layer 28 of the bottom package 2a is retained, and acts as a second solder mask layer. The molding process is conducted after the insulation layer 28 is directly attached to the solder mask layer 22 and patterned.

In the embodiment of FIG. 10, the insulation layer 28 is disposed on the solder mask layer 22, and patterned with a central opening 281a and a plurality of peripheral openings 281b. The central opening 281a exposes all of the first pads 212a and a portion of the solder mask layer 22, which underlies the die 23. The perimeter of the central opening 281a is larger than that of the die 23 to facilitate attaching the die 23. Locations of the peripheral openings 281b correspond to locations of the conductive pillars 29. The insulation layer 28 is patterned such that after the conductive pillars 29 are formed, the insulation layer 28 surrounds the side surfaces of the conductive pillars 29 thus isolating the conductive pillars 29 from one another. However, the insulation layer 28 leaves exposed the upper surfaces of the conductive pillars 29. Thus, the insulation layer 28 serves as another solder mask layer to protect the conductive pillars 29 and control solder flash. The upper surfaces of the conductive pillars 29 may be substantially coplanar with the upper surface of the insulation layer 28, or may be slightly recessed below the upper surface of the insulation layer 28. The molding compound 24 may encapsulate or overlap a portion of the insulation layer 28.

Figure 11:
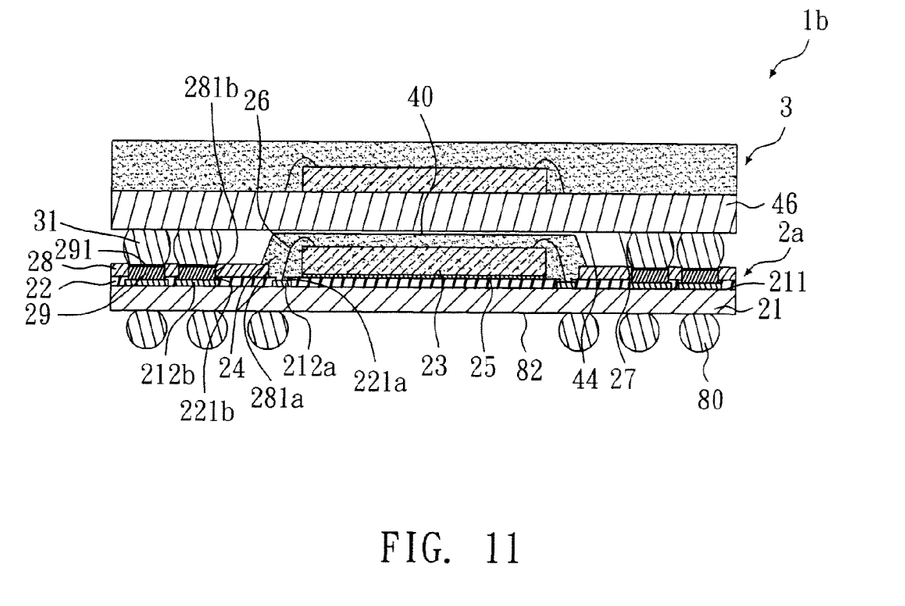
FIG. 11 is a cross-sectional view illustrating the stacked semiconductor package of FIG. 10 after final assembly.

FIG. 11 illustrates a cross-sectional view of the stacked semiconductor package 1b. The top package 3 is mechanically and electrically connected to the bottom package 2a by the conductive elements 31 and the conductive pillars 29, or the pillar finish layer 291, if present.

Figure 12:
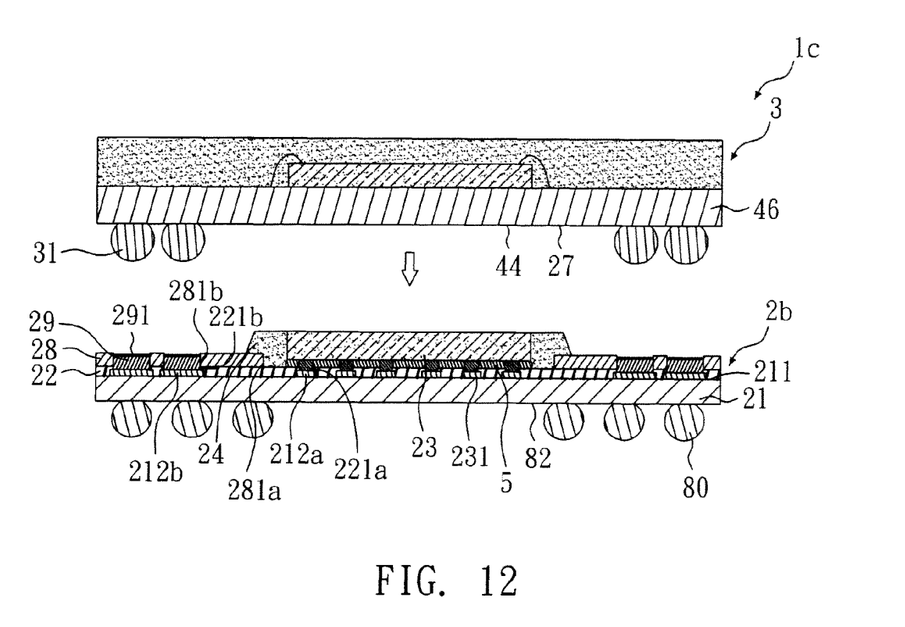
FIG. 12 is a cross-sectional view illustrating a stacked semiconductor package according to another of the present embodiments.

Referring to FIG. 12, a cross-sectional view of a stacked semiconductor package 1c according to another of the present embodiments is illustrated. The embodiment of FIG. 12 is similar to the embodiment of FIGS. 10 and 11, except that the die 23 is electrically connected to the substrate 21 by flip chip bonding in FIG. 12. Therefore, the die 23 further comprises a plurality of conductive bumps 231, which contact the first pads 212a. Further, the bottom package 2b further comprises an underfill 5 that is disposed between the die 23 and the solder mask layer 22 for protecting the bumps 231. As shown, the underfill 5 is also disposed in the central opening 281 of the insulation layer 28. Therefore, the thickness of the insulation layer 28 can prevent the underfill 5 from overflowing to the conductive pillars 29, i.e. prevent undesirable underfill flash. Moreover, in this embodiment, the top surface of the molding compound 24 is coplanar with the backside surface of the die 23.

Some conventional stacked semiconductor packages use abutting semi-spherical solder balls to interconnect the top and bottom packages. The solder balls are embedded in molding compound, which results in low thermal conduction. Therefore, when stacking solder balls to solder balls, the reflow temperature has to be further increased by about 3-5 degrees to fuse the solder balls. The drawbacks to this technique are that the package may warp and that elements on the motherboard may not be able to withstand such temperatures. In the present embodiments, advantageously, because of the conductive pillars 29, the reflow temperature to join the stacked packages is similar to that in current solder-to-pad joint processes.

The conductive pillars 29 of the present embodiments also provide finer pitch as compared to solder balls, because they don't lose their shape during reflow. The conductive pillars 29 also provide greater rigidity as compared to solder balls, leading to greater overall package strength and durability.

While the invention has been described and illustrated with reference to specific embodiments, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor device package, comprising:
a substrate having an upper surface;
a plurality of pads disposed on the substrate upper surface;
a die electrically connected to the substrate;
a solder mask layer disposed on the substrate upper surface and having a plurality of first openings exposing the pads;
an insulation layer disposed on the solder mask layer and including a plurality of second openings, positions of the second openings corresponding to positions of the first openings; and
a plurality of conductive pillars disposed on at least a subset of the pads, wherein at least a portion of the conductive pillars protrudes from the solder mask layer;
wherein a cross-sectional area of each of the first openings is substantially the same as a cross-sectional area of each of the second openings.

2. The semiconductor device package of claim 1, wherein at least a portion of side surfaces of the conductive pillars is covered by the solder mask layer.

3. The semiconductor device package of claim 1, further comprising a molding compound encapsulating the die and at least part of the solder mask layer.

4. The semiconductor device package of claim 1, wherein an upper surface of each pad further comprises a first surface finish layer on which the conductive pillars are disposed.

5. The semiconductor device package of claim 1, further comprising an insulation layer disposed on the solder mask layer, wherein the insulation layer has a plurality of peripheral openings, positions of the peripheral openings corresponding to positions of at least a portion of the openings in the solder mask layer, the conductive pillars being disposed in the peripheral openings.

6. The semiconductor device package of claim 1, wherein the pads comprise a plurality of first pads and a plurality of second pads, the openings comprise a plurality of first openings and a plurality of second openings, the positions of the first openings correspond to those of the first pads such that the first pads are exposed, the positions of the second openings correspond to those of the second pads such that the second pads are exposed, the conductive pillars are disposed on the second pads.

7. The semiconductor device package of claim 5, wherein the insulation layer comprises a photoresist.

8. The semiconductor device package of claim 1, wherein the package is a bottom package, and further comprising a top package stacked on the bottom package and electrically connected to the conductive pillars.

9. The semiconductor device package of claim 8, wherein the top package comprises a plurality of conductive elements that contact the conductive pillars.

10. The semiconductor device package of claim 1, further comprising a package body encapsulating the die where the plurality of conductive pillars are disposed outside a periphery of the package body.

11. A semiconductor device package, comprising:
a substrate having an upper surface;
a plurality of pads disposed on the substrate upper surface;
a die electrically connected to the substrate;
a solder mask layer disposed on the substrate upper surface and having a plurality of first openings exposing the pads;
an insulation layer disposed on the solder mask layer and including a plurality of second openings, positions of the second openings corresponding to positions of the first openings; and
a plurality of conductive pillars disposed on at least a subset of the pads, wherein the conductive pillars have a lesser width than the pads, such that the solder mask layer covers outer edges of upper surfaces of the pads, and further wherein each of the conductive pillars of at least a subset of the conductive pillars has a uniform width along its length.

12. The semiconductor device package of claim 11, wherein the package is a bottom package, and further comprising a top package stacked on the bottom package and electrically connected to the conductive pillars.

13. The semiconductor device package of claim 12, wherein the top package comprises a plurality of conductive elements that contact the conductive pillars.

14. The semiconductor device package of claim 11, further comprising a package body encapasulating the die where the plurality of conductive pillars are disposed outside a periphery of the package body.

15. The semiconductor device package of claim 11, further comprising a molding compound encapsulating the die and at least part of the solder mask layer.

16. The semiconductor device package of claim 11, further comprising an insulation layer disposed on the solder mask layer, wherein the insulation layer has a plurality of peripheral openings, the positions of the peripheral openings correspond to those of a portion of the openings in the solder mask layer, the conductive pillars are disposed in the peripheral openings.

17. A semiconductor device package, comprising:
a substrate having an upper surface;
a plurality of pads disposed on the substrate upper surface;
a die electrically connected to the substrate;

a first solder mask layer disposed on the substrate upper surface and having a plurality of first openings exposing the pads;

a second solder mask layer disposed on the first solder mask layer and including a plurality of second openings, positions of the second openings corresponding to positions of the first openings; and a plurality of conductive pillars disposed on at least a subset of the pads, wherein a height of at least a portion of the conductive pillars is greater than a height of the solder mask layer;

wherein a diameter of each of the first openings is substantially the same as a diameter of each of the second openings.

18. The semiconductor device package of claim 17, wherein portions of at least some of the conductive pillars are covered by the solder mask layer.

19. The semiconductor device package of claim 17, further comprising a molding compound encapsulating the die and at least part of the solder mask layer.

20. The semiconductor device package of claim 19, wherein the plurality of conductive pillars are disposed outside a periphery of the molding compound.

* * * * *